US012539520B2

United States Patent
(12) United States Patent
Watanabe et al.

(10) Patent No.: US 12,539,520 B2
(45) Date of Patent: Feb. 3, 2026

(54) SHOWER PLATE

(71) Applicant: KYOCERA Corporation, Kyoto (JP)

(72) Inventors: Daiki Watanabe, Satsumasendai (JP); Miki Hamada, Satsumasendai (JP); Yuusaku Ishimine, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 250 days.

(21) Appl. No.: 18/568,016

(22) PCT Filed: Jun. 7, 2022

(86) PCT No.: PCT/JP2022/022978
§ 371 (c)(1),
(2) Date: Dec. 7, 2023

(87) PCT Pub. No.: WO2022/260042
PCT Pub. Date: Dec. 15, 2022

(65) Prior Publication Data

US 2024/0131534 A1 Apr. 25, 2024
US 2024/0226922 A9 Jul. 11, 2024

(30) Foreign Application Priority Data

Jun. 7, 2021 (JP) ................................ 2021-095171

(51) Int. Cl.
*B05B 1/14* (2006.01)
*B05B 1/24* (2006.01)
*C23C 16/455* (2006.01)

(52) U.S. Cl.
CPC .................. *B05B 1/14* (2013.01); *B05B 1/24* (2013.01); *C23C 16/45565* (2013.01); *C23C 16/4557* (2013.01)

(58) Field of Classification Search
CPC ....... B05B 1/14; B05B 1/24; C23C 16/45565; C23C 16/4557
USPC .................................................. 239/135, 139
See application file for complete search history.

(56) References Cited

U.S. PATENT DOCUMENTS 5,900,103 A * 5/1999 Tomoyasu .......... C23C 16/4405 204/298.34
5,950,925 A 9/1999 Fukunaga et al.
6,264,788 B1 * 7/2001 Tomoyasu .......... C23C 16/4405 156/345.43
(Continued)

FOREIGN PATENT DOCUMENTS

JP 10-168572 A 6/1998
JP 11-302850 A 11/1999
(Continued)

*Primary Examiner* — Steven J Ganey
(74) *Attorney, Agent, or Firm* — Procopio, Cory, Hargreaves & Savitch LLP

(57) ABSTRACT

A shower plate includes a base, a resistance heating element, a channel, and a hollow portion. The base is made of ceramic and has a plate shape. The resistance heating element is located inside the base along a first surface of the base. The channel is located inside the base and includes an intermediate channel that is located between the resistance heating element and a second surface on a side opposite to the first surface of the base and extends in a planar direction of the base. The hollow portion is located adjacent to the intermediate channel in the planar direction of the base inside the base.

20 Claims, 7 Drawing Sheets

(56) References Cited

U.S. PATENT DOCUMENTS

| | | | | |
|---|---|---|---|---|
| 2002/0088547 | A1* | 7/2002 | Tomoyasu ........ | H01J 37/32082 156/345.43 |
| 2021/0079526 | A1 | 3/2021 | Iizuka | |
| 2021/0285104 | A1 | 9/2021 | Kim | |

FOREIGN PATENT DOCUMENTS

| | | | |
|---|---|---|---|
| JP | 2004-281648 | A | 10/2004 |
| JP | 2019-220639 | A | 12/2019 |
| WO | 2019/235282 | A1 | 12/2019 |
| WO | 2020/009478 | A1 | 1/2020 |

* cited by examiner

SHOWER PLATE

CROSS-REFERENCE TO RELATED APPLICATIONS

This application is national stage application of International Application No. PCT/JP2022/022978 filed on Jun. 7, 2022, which designates the United States, incorporated herein by reference, and which claims the benefit of priority from Japanese Patent Application No. 2021-095171, filed on Jun. 7, 2021, the entire contents of which are incorporated herein by reference.

TECHNICAL FIELD

Embodiments of the disclosure relate to shower plates.

BACKGROUND OF INVENTION

In a semiconductor manufacturing process, for example, a shower plate that ejects a heated process gas to a substrate such as a semiconductor wafer has been used. Examples of such a known shower plate include a shower plate including a disk-shaped base made of ceramic, a channel formed inside the base, and a resistance heating element buried in the base.

CITATION LIST

Patent Literature

Patent Document 1: WO 2020/009478

SUMMARY

A shower plate according to an aspect of an embodiment includes a base, a resistance heating element, a channel, and a hollow portion. The base is made of ceramic and has a plate shape. The resistance heating element is located inside the base along a first surface of the base. The channel is located inside the base and includes an intermediate channel that is located between the resistance heating element and a second surface on a side opposite to the first surface of the base and extends in a planar direction of the base. The hollow portion is located adjacent to the intermediate channel in the planar direction of the base inside the base.

DESCRIPTION OF EMBODIMENTS

Hereinafter, embodiments of shower plates disclosed in the present application will be described with reference to the accompanying drawings. The present disclosure is not limited by the following embodiments. Note that the drawings are schematic and that the dimensional relationships between elements, the proportions of the elements, and the like may differ from the actual ones. There may be differences between the drawings in terms of dimensional relationships, proportions, and the like.

In the following embodiments, expressions such as "constant", "orthogonal", "perpendicular", and "parallel" may be used, but these expressions do not need to be exactly "constant", "orthogonal", "perpendicular", and "parallel". In other words, it is assumed that the above expressions allow deviations in manufacturing accuracy, installation accuracy, or the like.

Embodiments can be appropriately combined so as not to contradict each other in terms of processing content. In the following embodiments, the same portions are denoted by the same reference signs, and overlapping explanations are omitted.

First Embodiment

Figure 1:
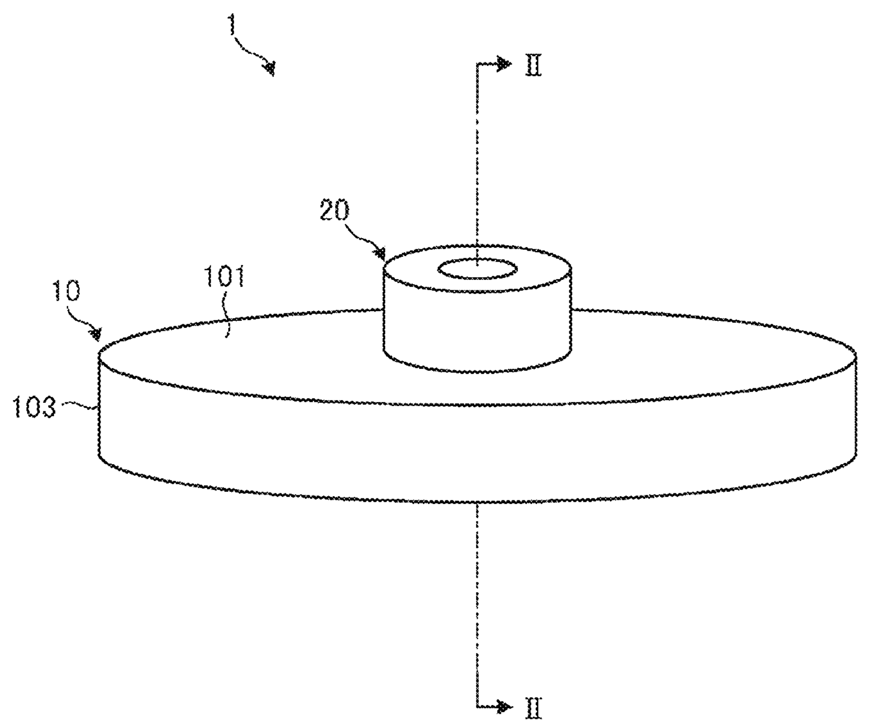
FIG. 1 is a schematic perspective view of a shower plate according to a first embodiment.
Figure 2:
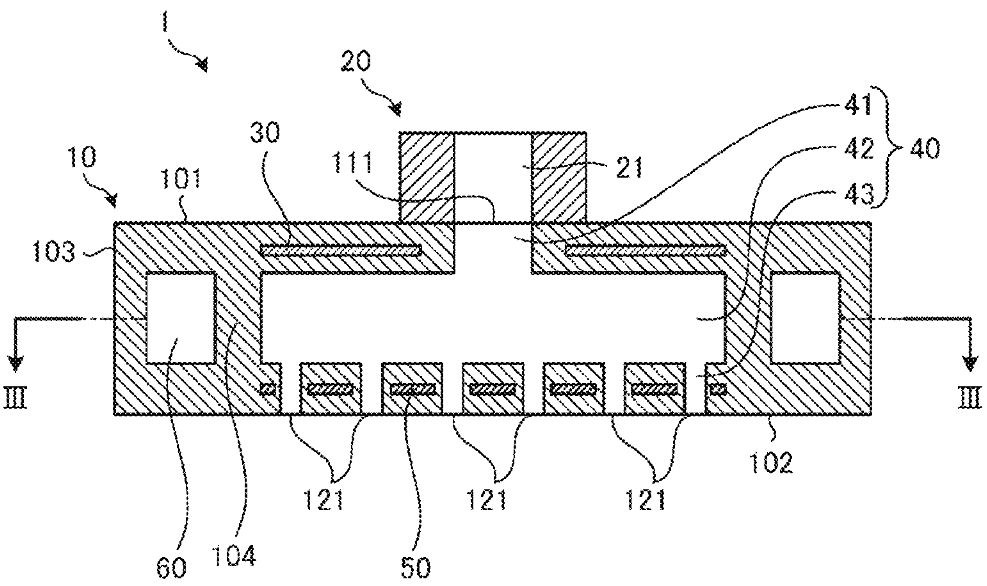
FIG. 2 is a schematic cross-sectional view of the shower plate according to the first embodiment.
Figure 3:
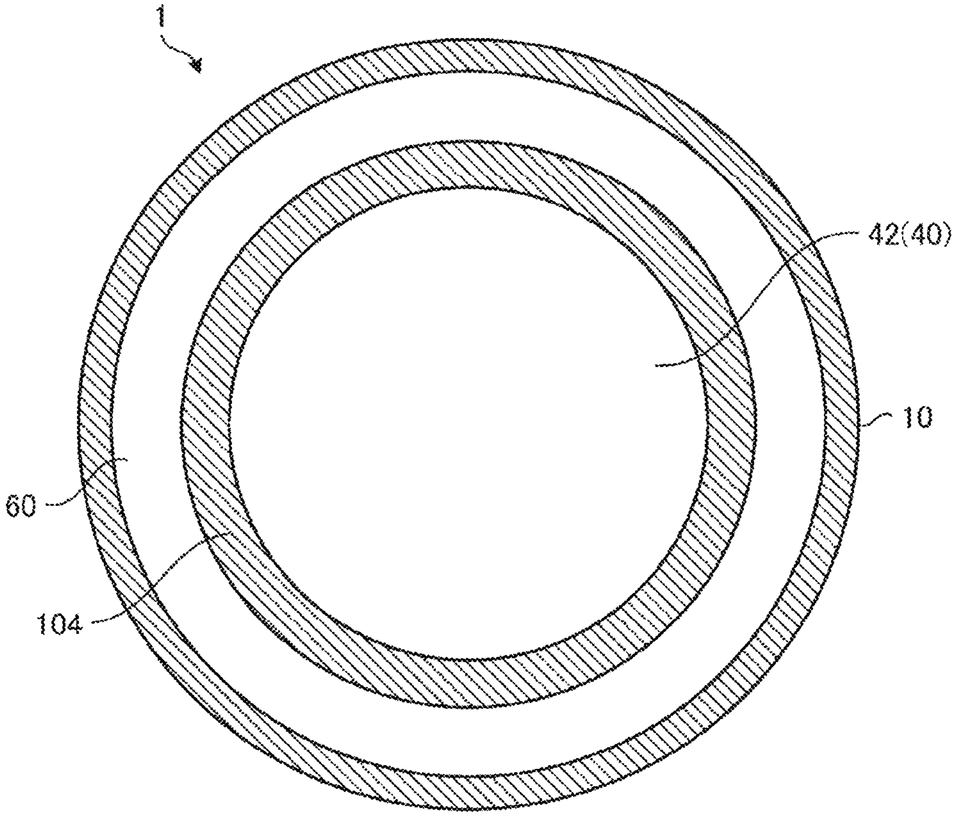
FIG. 3 is a schematic cross-sectional view taken along a line in FIG. 2.

FIG. 1 is a schematic perspective view of a shower plate 1 according to a first embodiment. FIG. 2 is a schematic cross-sectional view of the shower plate 1 according to the first embodiment. FIG. 3 is a schematic cross-sectional view taken along a line III-III in FIG. 2. FIG. 2 illustrates the schematic cross-sectional view taken along a line II-II in FIG. 1.

The shower plate 1 according to the first embodiment illustrated in FIG. 1 ejects a heated process gas (an example of a fluid) to a substrate such as a semiconductor wafer in a semiconductor manufacturing process, for example. The shower plate 1 is mounted on, for example, a substrate processing apparatus configured to perform plasma treatment or the like on a substrate.

As illustrated in FIG. 1 and FIG. 2, the shower plate 1 includes a base 10, a shaft 20, a resistance heating element 30, a channel 40, and an electrode 50. In the following description, a direction extending from the base 10 toward the shaft 20 is referred to as an upward direction, and a direction extending from the shaft 20 toward the base 10 is referred to as a downward direction. Note that, however, the shower plate 1 may be used in any posture, for example, may be used upside down.

The base 10 has a disk shape with a thickness in an up-down direction. Specifically, the base 10 has an upper surface (an example of a first surface) 101 and a lower surface (an example of a second surface) 102 being circular in plan view, and a side surface 103 being continuous with the upper surface 101 and the lower surface 102. The upper surface 101 and the lower surface 102 of the base 10 are substantially parallel to each other.

The base 10 is made of ceramic, for example, and has an insulative property. The ceramic constituting the base 10 is a sintered body that includes, as a main ingredient, for example, aluminum nitride (AlN), aluminum oxide ($Al_2O_3$, alumina), yttrium oxide ($Y_2O_3$, yttria), silicon carbide (SiC), or silicon nitride ($Si_3N_4$). The main ingredient accounts for 50 mass % or more or 80 mass % or more of the material, for example.

Note that the shape of the base 10 is optional. For example, the base 10 is formed in a disk shape in the present embodiment, but is not limited thereto, and may be formed in an elliptical plate shape, a rectangular plate shape, a trapezoidal plate shape, or the like.

The shaft 20 is a member for introducing the process gas into the shower plate 1. The shaft 20 has, for example, a cylindrical shape. The shaft 20 has a through hole 21 passing through the shaft 20 from one end surface (here, the upper surface) to the other end surface (here, the lower surface). The shaft 20 is connected to the upper surface 101 of the base 10. In one aspect, the shaft 20 is bonded (adhered) to the upper surface 101 of the base 10 with an adhesive. In another aspect, the shaft 20 may be bonded to the base 10 by solid phase bonding. The material of the shaft 20 is optional. For example, a ceramic that is the same as and/or similar to that of the base 10 may be used as the material of the shaft 20.

As illustrated in FIG. 2, the resistance heating element 30 is located inside the base 10 along the upper surface 101 of the base 10. The resistance heating element 30 is, for example, made of a metal such as Ni, W, Mo or Pt, or an alloy including at least one of the above-mentioned metals.

The resistance heating element 30 extends along the upper surface 101 of the base 10. The resistance heating element 30 has, for example, a disk shape in which an opening is formed at a center portion corresponding to the through hole 21 of the shaft 20 in plan view.

The resistance heating element 30 generates heat by Joule heating generated by electrical power supplied from a power supply unit (not illustrated). The resistance heating element 30 heats the channel 40 from the upper surface 101 side of the base 10 with the generating heat. Thus, the shower plate 1 can heat the process gas flowing through the channel 40.

The channel 40 is located inside the base 10. The channel 40 connects an introduction port 111 located in the upper surface 101 of the base 10 and a plurality of lead-out ports 121 located in the lower surface 102 of the base 10. The introduction port 111 communicates with the through hole 21 of the shaft 20.

Specifically, the channel 40 includes an introduction path 41, an intermediate channel 42, and a plurality of lead-out paths 43.

The introduction path 41 communicates with the introduction port 111, and connects the introduction port 111 and the intermediate channel 42. For example, the introduction path 41 extends from the introduction port 111 in the thickness direction of the base 10 and communicates with the intermediate channel 42.

The intermediate channel 42 is located between the resistance heating element 30 and the lower surface 102 of the base 10. The intermediate channel 42 extends in the planar direction of the base 10 along the lower surface 102 of the base 10. The planar direction of the base 10 is a direction substantially parallel to the upper surface 101 and the lower surface 102 of the base 10. The intermediate channel 42 may have a portion that is not located between the resistance heating element 30 and the lower surface 102 of the base 10.

The lead-out path 43 communicates with the intermediate channel 42 and connects the intermediate channel 42 and the lead-out port 121. For example, the lead-out path 43 extends from a bottom surface of the intermediate channel 42 in the thickness direction of the base 10 and communicates with the lead-out port 121.

The channel 40 is configured as described above, and can lead the process gas that is introduced into the introduction path 41 from the introduction port 111 through the through hole 21 of the shaft 20 and flows through the intermediate channel 42 and the lead-out path 43, to the lower side of the lower surface 102 of the base 10 from the lead-out port 121.

The electrode 50 is located between the intermediate channel 42 and the lower surface 102 of the base 10 inside the base 10. Similar to the resistance heating element 30, the electrode 50 is, for example, made of a metal such as Ni, W, Mo or Pt, or an alloy including at least one of the above-mentioned metals.

The electrode 50 extends along the lower surface 102 of the base 10. The electrode 50 has, for example, a disk shape in plan view. The electrode 50 has a through hole with a diameter larger than that of the lead-out path 43 corresponding to the position of the lead-out path 43 of the base 10.

The electrode 50 is an RF (radio frequency) electrode to which RF electrical power for generating plasma can be applied. When RF electrical power is applied from an RF power supply (not illustrated), the electrode 50 may convert the process gas to be led out from the lead-out port 121 to the lower side of the lower surface 102 of the base 10 into plasma.

In the substrate processing apparatus on which the shower plate 1 is mounted, when the RF electrical power is applied to the electrode 50 to generate plasma, the channel 40 in the inner portion of the base 10 is heated by the resistance heating element 30, thereby heating the process gas flowing through the channel 40 to a temperature suitable for the generation of plasma.

In general, in the shower plate 1, none of the resistance heating element 30, the channel 40, and the electrode 50 extend to the vicinity of the side surface 103 of the base 10. This is because if the resistance heating element 30, the channel 40, and the electrode 50 are extended to the vicinity of the side surface 103 of the base 10, delamination may occur in the base 10. For this reason, the resistance heating element 30, the channel 40, and the electrode 50 are disposed at a certain distance from the side surface 103 of the base 10. In other words, the resistance heating element 30, the channel 40, and the electrode 50 are smaller in diameter than the lower surface 102 of the base 10.

The heat of the channel 40 heated by the resistance heating element 30 is not only transmitted to the process gas flowing through the channel 40, but also transmitted from the channel 40 to the outside in the planar direction of the base 10 to be finally released from the side surface 103 of the base 10 into the external atmosphere. In particular, in the channel 40, the heat of the intermediate channel 42, which is least distanced from the side surface 103 of the base 10, is easily transmitted to the outside in the planar direction of the base 10. When the heat of the intermediate channel 42 is transmitted to the outside in the planar direction of the base 10, the temperature of the process gas flowing through the channel 40 may be locally lowered, and thermal uniformity of the process gas may be degraded. The degradation in thermal uniformity of the process gas flowing through the channel 40 causes a solidified material of the process gas to be generated in the channel 40, which is not preferable. In order to improve the thermal uniformity of the process gas flowing through the channel 40, thermal conduction from the intermediate channel 42, which is least distanced from the side surface 103 of the base 10 in the channel 40, to the outside in the planar direction of the base 10 is desired to be suppressed.

In consideration of the above desire, the shower plate 1 according to the present embodiment includes a hollow portion 60 inside the base 10. The hollow portion 60 is located adjacent to the intermediate channel 42 of the channel 40 in the planar direction of the base 10. Specifically, the hollow portion 60 is located adjacent to the intermediate channel 42 with a partition wall 104, which is formed integrally with the base 10, interposed therebetween.

A gas having a lower coefficient of thermal conductivity than that of the ceramic constituting the base 10 is stored inside the hollow portion 60. Therefore, since the hollow portion 60 is located adjacent to the intermediate channel 42 of the channel 40 in the planar direction of the base 10, the thermal conduction from the intermediate channel 42 to the outside in the planar direction of the base 10 can be suppressed. As a result, the thermal uniformity of the process gas flowing through the channel 40 may be improved. This can reduce the generation of the solidified material of the process gas in the channel 40 and to reduce the occurrence of substrate failure caused by the adhesion of the solidified material to the substrate.

The hollow portion 60 is located between the intermediate channel 42 and the side surface 103 of the base 10. By providing the hollow portion 60 between the intermediate channel 42 and the side surface 103 of the base 10, a situation in which the heat of the channel 40 heated by the resistance heating element 30 is transmitted to the outside in the planar direction of the base 10 to be finally released from the side surface 103 of the base 10 into the external atmosphere may be suppressed.

Different gases may be stored inside the hollow portion 60 in accordance with the ceramic constituting the base 10. For example, when the ceramic constituting the base 10 is aluminum oxide or yttrium oxide, the gas stored in the hollow portion 60 may be a gas containing at least nitrogen and argon and having a larger volume ratio of nitrogen and argon than that of air. For example, when the ceramic constituting the base is aluminum nitride or silicon nitride, the gas stored in the hollow portion 60 may be a gas containing at least nitrogen and having a larger volume ratio of nitrogen than that of air. Storing these gases inside the hollow portion 60 can suppress the thermal conduction from the intermediate channel 42 to the outside in the planar direction of the base 10 by using an appropriate gas in accordance with the type of ceramic constituting the base 10.

The inner portion of the hollow portion 60 may be in a vacuum state or a reduced pressure state. The reduced pressure state refers to a state in which the pressure inside the hollow portion 60 is lower than the atmospheric pressure. Making the inner portion of the hollow portion 60 in a vacuum state or a reduced pressure state can suppress, when the inner portion of the hollow portion 60 is a closed space, a situation in which thermal expansion of the gas applies a load on the base 10.

In a view of a cross section illustrated in FIG. 3, that is, in a view of a cross section in the planar direction of the base 10, which is a cross section passing through the hollow portion 60, the hollow portion 60 extends in an annular shape surrounding the outer periphery of the intermediate channel 42. This can suppress the thermal conduction from the intermediate channel 42 to the outside in the planar direction of the base 10 at the whole perimeter of the base 10. The hollow portion 60 need not necessarily extend in the annular shape. For example, the hollow portion 60 may be disposed while being divided into a plurality of circular arc-shaped spaces along the outer periphery of the intermediate channel 42.

Second Embodiment

Figure 4:
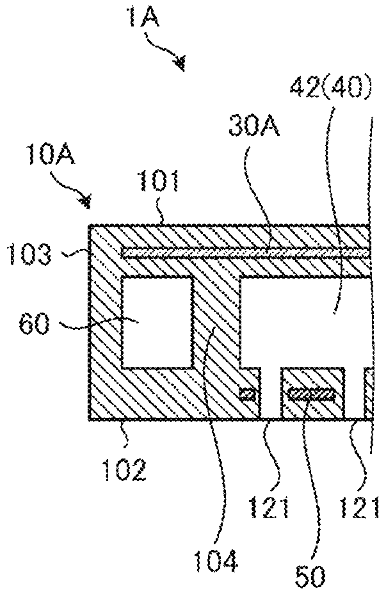
FIG. 4 is a schematic cross-sectional view of a hollow portion and its surroundings in a shower plate according to a second embodiment.

FIG. 4 is a schematic cross-sectional view of a hollow portion 60 and its surroundings in a shower plate 1A according to a second embodiment. As illustrated in FIG. 4, in the shower plate 1A according to the second embodiment, a base 10A includes a resistance heating element 30A. The resistance heating element 30A extends to a position corresponding to the hollow portion 60 in the planar direction of the base 10A.

By generating heat, the resistance heating element 30A can heat not only a channel 40 (that is, an intermediate channel 42) from the side of an upper surface 101 of the base 10A, but also the hollow portion 60 located adjacent to the intermediate channel 42.

As described above, since the resistance heating element 30A extends to the position corresponding to the hollow portion 60 in the planar direction of the base 10A, a difference in temperature between the hollow portion 60 and the intermediate channel 42 can be reduced, whereby thermal conduction from the intermediate channel 42 to the outside in the planar direction of the base 10A may be further suppressed.

Third Embodiment

Figure 5:
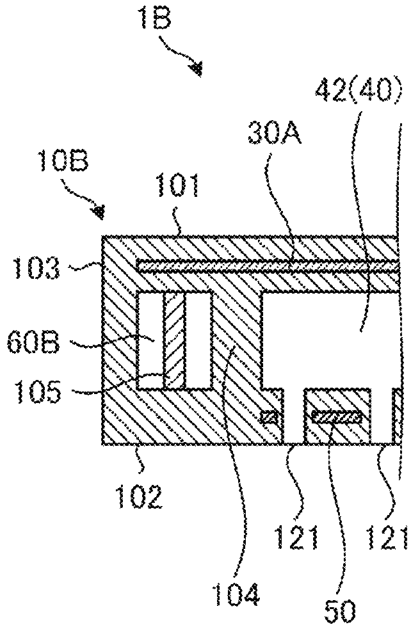
FIG. 5 is a schematic cross-sectional view of a hollow portion and its surroundings in a shower plate according to a third embodiment.

FIG. 5 is a schematic cross-sectional view of a hollow portion 60B and its surroundings in a shower plate 1B according to a third embodiment. As illustrated in FIG. 5, in the shower plate 1B according to the third embodiment, a base 10B includes the hollow portion 60B. The hollow portion 60B includes a support 105. The upper end of the support 105 is located on a ceiling surface of the hollow portion 60B, and the lower end thereof is located on the bottom surface of the hollow portion 60B. As the material of the support 105, a ceramic that is the same as and/or similar to that of the base 10 may be used.

As described above, since the hollow portion 60B includes the support 105, the transmission of heat generated in a resistance heating element 30A to a lower surface 102 of a base 10B through the support 105 can be promoted. As a result, the temperature of the process gas led out from a lead-out port 121 to the lower side of the lower surface 102 of the base 10B can be maintained at a temperature suitable for the generation of plasma. In addition, since the hollow portion 60B includes the support 105, the strength of the base 10B may be enhanced.

Fourth Embodiment

Figure 6:
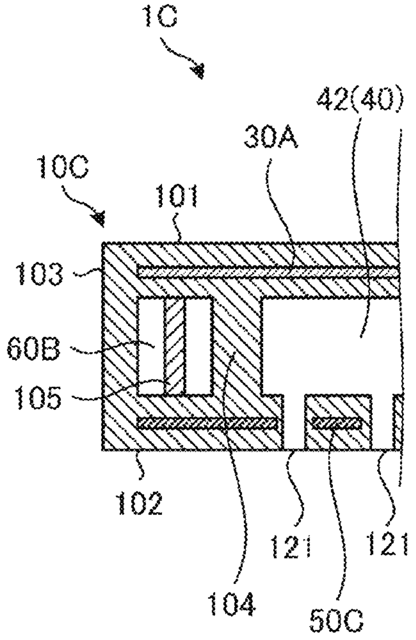
FIG. 6 is a schematic cross-sectional view of a hollow portion and its surroundings in a shower plate according to a fourth embodiment.

FIG. 6 is a schematic cross-sectional view of a hollow portion 60B and its surroundings in a shower plate 1C according to a fourth embodiment. As illustrated in FIG. 6, in the shower plate 1C according to the fourth embodiment, a base 10C includes an electrode 50C. The electrode 50C extends to a position corresponding to the lower end of a support 105 in the planar direction of the base 10C.

As described above, since the electrode 50C extends to the position corresponding to the lower end of the support 105 in the planar direction of the base 10C, the transmission of heat generated in a resistance heating element 30A to the electrode 50C through the support 105 can be promoted, and the temperature of the electrode 50C may be appropriately adjusted.

Fifth Embodiment

Figure 7:
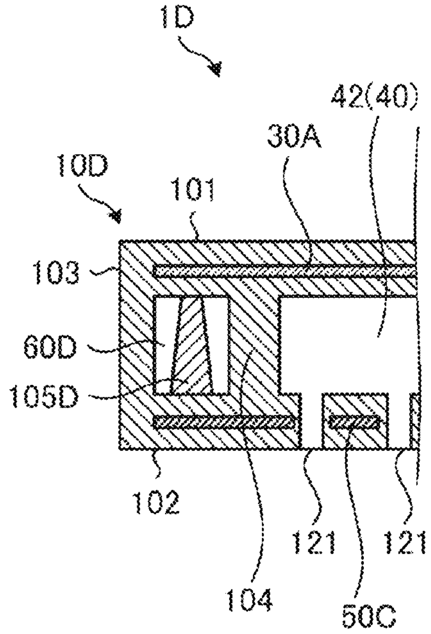
FIG. 7 is a schematic cross-sectional view of a hollow portion and its surroundings in a shower plate according to a fifth embodiment.

FIG. 7 is a schematic cross-sectional view of a hollow portion 60D and its surroundings in a shower plate 1D according to a fifth embodiment. As illustrated in FIG. 7, in the shower plate 1D according to the fifth embodiment, a base 10D includes the hollow portion 60D. The hollow portion 60D includes a support 105D. The support 105D has a shape that grows wider toward the lower end of the support 105D located on the bottom surface of the hollow portion 60D. The side surface of the support 105D is a tapered surface.

As described above, since the width of the support 105D in the hollow portion 60D becomes wider toward the lower end of the support 105D, the transmission of heat generated in a resistance heating element 30A to a lower surface 102 of the base 10D through the support 105D can be further promoted.

Sixth Embodiment

Figure 8:
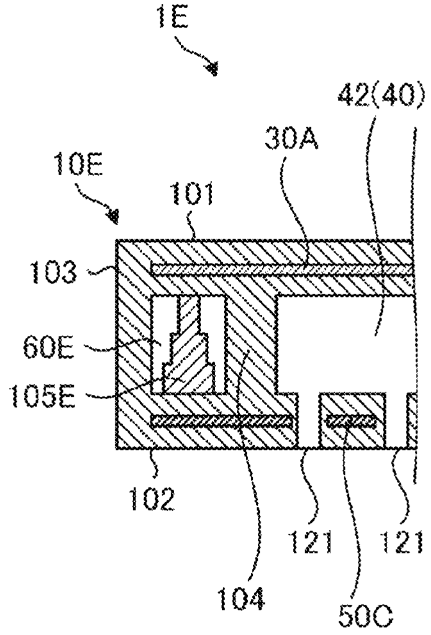
FIG. 8 is a schematic cross-sectional view of a hollow portion and its surroundings in a shower plate according to a sixth embodiment.

FIG. 8 is a schematic cross-sectional view of a hollow portion 60E and its surroundings in a shower plate 1E according to a sixth embodiment. As illustrated in FIG. 8, in the shower plate 1E according to the sixth embodiment, a base 10E includes the hollow portion 60E. The hollow portion 60E includes a support 105E. Similar to the support 105D of the fifth embodiment, the support 105E has a shape that grows wider toward the lower end of the support 105E located on the bottom surface of the hollow portion 60E. The side surface of the support 105E is a stepped surface.

As described above, the support 105E in the hollow portion 60E has a stepped surface on the side surface thereof. Also in this case, an effect that is the same as and/or similar to that of the shower plate 1D according to the fifth embodiment can be obtained. That is, the transmission of heat generated in a resistance heating element 30A to a lower surface 102 of the base 10E through the support 105E can be further promoted.

Seventh Embodiment

Figure 9:
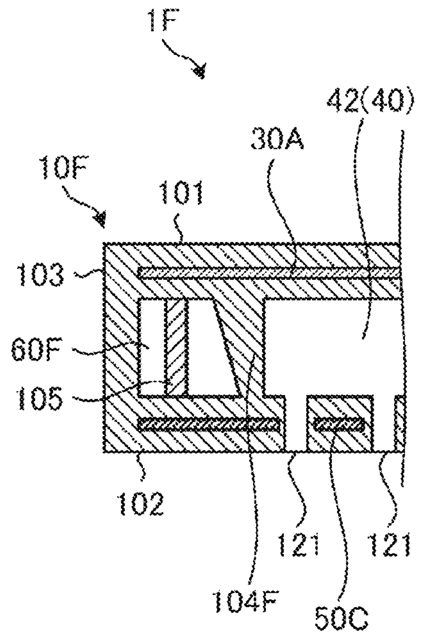
FIG. 9 is a schematic cross-sectional view of a hollow portion and its surroundings in a shower plate according to a seventh embodiment.

FIG. 9 is a schematic cross-sectional view of a hollow portion 60B and its surroundings in a shower plate 1F according to a seventh embodiment. As illustrated in FIG. 9, in the shower plate 1F according to the seventh embodiment, a base 10F includes the hollow portion 60F. The hollow portion 60F is located adjacent to an intermediate channel 42 with a partition wall 104F interposed therebetween.

One wall surface of the partition wall 104F located on the hollow portion 60F side comes closer to the other wall surface thereof located on the intermediate channel 42 side as the distance from a resistance heating element 30A increases. The one wall surface of the partition wall 104F located on the hollow portion 60F side is a tapered surface.

As described above, bringing the one wall surface of the partition wall 104F on the hollow portion 60F side closer to the other wall surface thereof on the intermediate channel 42 side can concentrate heat generated in the resistance heating element 30A on an inner side surface of the intermediate channel 42 to suppress thermal conduction from the intermediate channel 42 to the outside in the planar direction of the base 10F.

Eighth Embodiment

Figure 10:
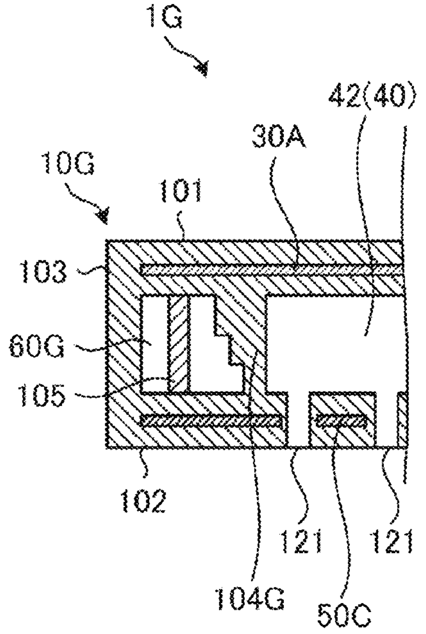
FIG. 10 is a schematic cross-sectional view of a hollow portion and its surroundings in a shower plate according to an eighth embodiment.

FIG. 10 is a schematic cross-sectional view of a hollow portion 60G and its surroundings in a shower plate 1G according to an eighth embodiment. As illustrated in FIG. 10, in the shower plate 1G according to the eighth embodiment, a base 10G includes the hollow portion 60G. The hollow portion 60G is located adjacent to an intermediate channel 42 with a partition wall 104G interposed therebetween.

As in the partition wall 104F of the seventh embodiment, one wall surface of the partition wall 104G located on the hollow portion 60G side comes closer to the other wall surface thereof located on the intermediate channel 42 side as the distance from a resistance heating element 30A increases. The one wall surface of the partition wall 104G located on the hollow portion 60G side is a stepped surface.

As described above, the one wall surface of the partition wall 104G located on the hollow portion 60G side is a stepped surface. Also in this case, an effect that is the same as and/or similar to that of the shower plate 1F according to the seventh embodiment can be obtained. That is, heat generated in the resistance heating element 30A can be concentrated on an inner side surface of the intermediate channel 42 to suppress thermal conduction from the intermediate channel 42 to the outside in the planar direction of the base 10G.

Ninth Embodiment

Figure 11:
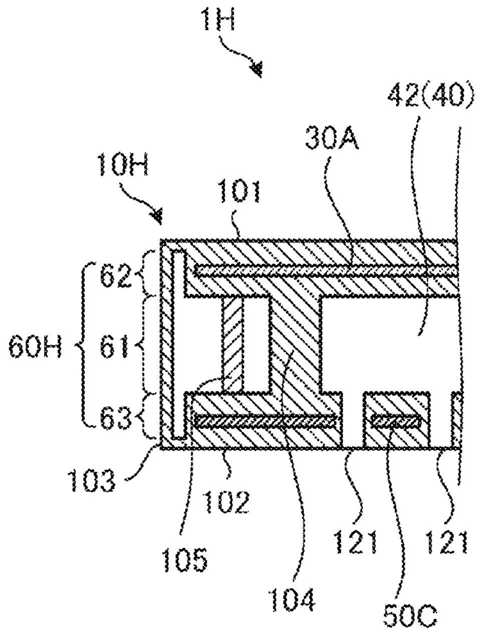
FIG. 11 is a schematic cross-sectional view of a hollow portion and its surroundings in a shower plate according to a ninth embodiment.

FIG. 11 is a schematic cross-sectional view of a hollow portion 60H and its surroundings in a shower plate 1H according to a ninth embodiment. As illustrated in FIG. 11, in the shower plate 1H according to the ninth embodiment, a base 10H includes the hollow portion 60H.

The hollow portion 60H includes a first hollow portion 61, a second hollow portion 62, and a third hollow portion 63. The first hollow portion 61 is located adjacent to an intermediate channel 42 in the planar direction of the base 10H.

The second hollow portion 62 is located adjacent to a resistance heating element 30A in the planar direction of the base 10H. The second hollow portion 62 communicates with the first hollow portion 61.

The third hollow portion 63 is located adjacent to an electrode 50C in the planar direction of the base 10H. The third hollow portion 63 communicates with the first hollow portion 61.

As described above, the hollow portion 60H may include the second hollow portion 62 located adjacent to the resistance heating element 30A in the planar direction of the base 10H. According to the above-discussed configuration, in addition to thermal conduction from the intermediate channel 42 to the outside in the planar direction of the base 10H, thermal conduction from the resistance heating element 30A to the outside in the planar direction of the base 10H can be suppressed. Further, since the first hollow portion 61 and the second hollow portion 62 communicate with each other, the thermal conduction from the resistance heating element 30A to the outside in the planar direction of the base 10H can be further suppressed.

The hollow portion 60H may include the third hollow portion 63 located adjacent to the electrode 50C in the planar direction of the base 10H. According to the above-discussed configuration, in addition to the thermal conduction from the intermediate channel 42 to the outside in the planar direction of the base 10H, thermal conduction from the electrode 50C to the outside in the planar direction of the base 10H can be suppressed. Further, since the first hollow portion 61 and the third hollow portion 63 communicate with each other, the thermal conduction from the electrode 50C to the outside in the planar direction of the base 10H can be further suppressed.

Tenth Embodiment

Figure 12:
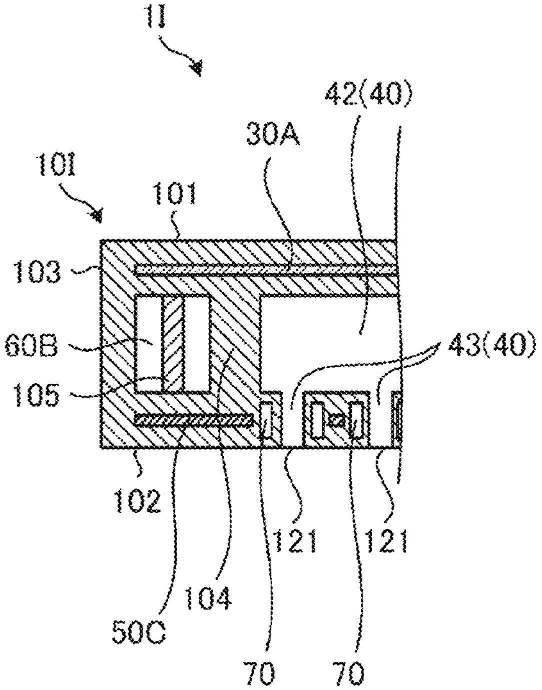
FIG. 12 is a schematic cross-sectional view of a hollow portion and its surroundings in a shower plate according to a tenth embodiment.

FIG. 12 is a schematic cross-sectional view of a hollow portion 60B and its surroundings in a shower plate 1I according to a tenth embodiment. As illustrated in FIG. 12, in the shower plate 1I according to the tenth embodiment, a base 10I includes a hollow portion 70 in addition to the hollow portion 60B.

The hollow portion 70 is located adjacent to each lead-out path 43 in the planar direction of the base 10I. A gas having a lower coefficient of thermal conductivity than that of the ceramic constituting the base 10I is stored inside the hollow portion 70. The gas stored in the hollow portion 70 may be the same as the gas stored in the hollow portion 60B. In a view of a cross section in the planar direction of the base 10I, which is a cross section passing through the hollow portion 70, the hollow portion 70 extends in an annular shape surrounding the outer periphery of each lead-out path 43.

As described above, the shower plate 1I may include the hollow portion 70 located adjacent to each lead-out path 43 in the planar direction of the base 10I inside the base 10I. According to the above-discussed configuration, in addition to the thermal conduction from an intermediate channel 42 to the outside in the planar direction of the base 10I, the thermal conduction from each lead-out path 43 to the outside in the planar direction of the base 10I can be suppressed, whereby the thermal uniformity of the process gas flowing through a channel 40 may be further improved.

Eleventh Embodiment

Figure 13:
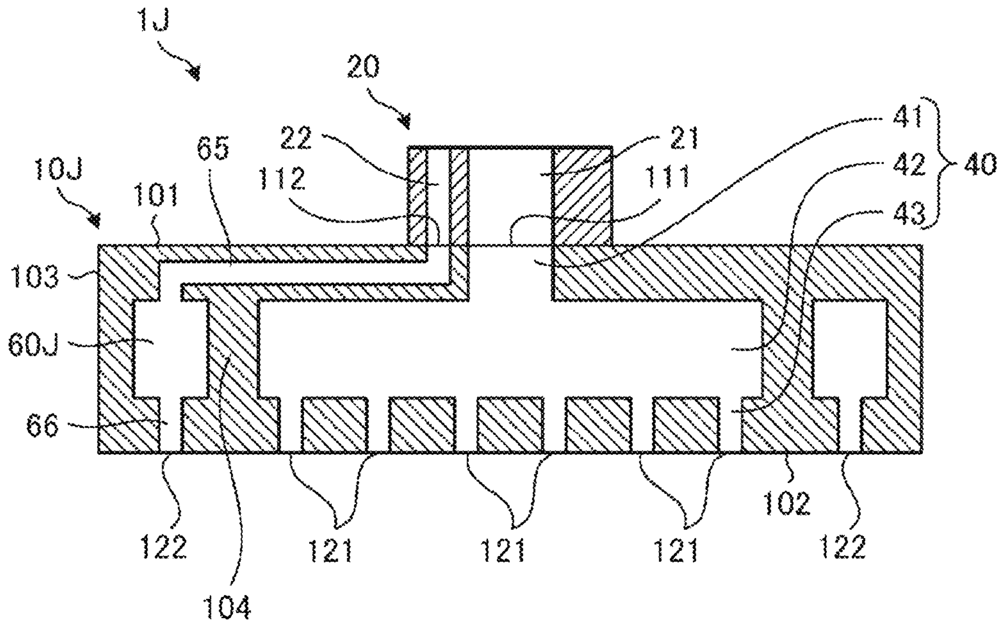
FIG. 13 is a schematic cross-sectional view of a shower plate according to an eleventh embodiment.

FIG. 13 is a schematic cross-sectional view of a shower plate 1J according to an eleventh embodiment. The resistance heating element 30 and the electrode 50 illustrated in FIG. 2 are omitted in FIG. 13 for convenience.

As illustrated in FIG. 13, in the shower plate 1J according to the eleventh embodiment, a base 10J includes a hollow portion 60J. A shaft 20 has a through hole 22 passing through the shaft 20 from one end surface (here, the upper surface) to the other end surface (here, the lower surface).

The hollow portion 60J is a channel through which another fluid different from the process gas flowing through a channel 40 flows. Examples of the other fluid flowing through the hollow portion 60J include inert gases such as N2, Ar, and He.

The hollow portion 60J connects an introduction port 112 located in an upper surface 101 of the base 10J and a plurality of lead-out ports 122 located in a region surrounding a plurality of lead-out ports 121 in a lower surface 102 of the base 10J. To be specific, the hollow portion 60J communicates with the introduction port 112 through an introduction path 65 and also communicates with the lead-out port 122 through a lead-out path 66. The introduction port 112 communicates with the through hole 22 in the shaft 20.

The hollow portion 60J is configured as described above. The other fluid different from the process gas flowing through the channel 40 is introduced into the introduction path 65 from the introduction port 112 through the through hole 22 in the shaft 20, flows through the hollow portion 60J and the lead-out path 66, and then is led out from the lead-out port 122 to the lower side of the lower surface 102 of the base 10J.

As discussed above, the hollow portion 60J is allowed to be a channel through which another fluid different from the process gas flowing through the channel 40 flows. In this case, the channel for the other fluid is not needed to be provided separately from the channel 40 for the process gas. The other fluid is led out from the lead-out port 122 to the lower side of the lower surface 102 of the base 10J, thereby making it possible to suppress the diffusion of the process gas led out from the lead-out port 121 to the lower side of the lower surface 102 of the base 10J.

Other Embodiments

In the embodiments described above, the bases 10 and 10A to 10J may not be formed by bonding a plurality of members, but may be integrally formed. Since such a configuration does not need to include, for example, a bonding layer, reliability for the heat cycle may be improved.

In the above-described embodiments, a support supporting a ceiling portion of each of the hollow portions 60, 60B, 60D, 60E to 60H, and 60J may be located inside a corresponding one of the hollow portions 60, 60B, 60D, 60E to 60H, and 60J. Such a configuration may promote thermal conduction in the thickness direction of the bases 10 and 10A to 10J.

In the above-described embodiments, the partition walls 104, 104F, and 104G separating the hollow portions 60, 60B, 60D, 60E to 60H, and 60J from the intermediate channel 42 in the bases 10 and 10A to 10J may include a recessed portion in the wall surface on a side of the hollow portion. According to the above configuration, foreign matters in the process gas flowing through the channel 40 may be held in the recessed portion.

Manufacturing Method of Shower Plate

Next, a manufacturing method of a shower plate according to the present disclosure will be described. Herein, the manufacturing method of the shower plate 1 according to the first embodiment will be described as an example. In the manufacturing method of the shower plate, the base and the shaft are separately manufactured. Thereafter, these members are fixed to each other. The base and the shaft may be integrally manufactured partially or entirely. The manufacturing method of the shaft may be, for example, the same as and/or similar to the various known methods.

First, the base is molded by laminating a plurality of ceramic green sheets. Specifically, ceramic green sheets for constituting the base, a metal sheet for constituting a resistance heating element, and a metal sheet for constituting an electrode are prepared. Here, in order to form the channel and the hollow portion, a plurality of types of ceramic green sheets having different shapes are prepared. Then, the prepared sheets are laminated.

Subsequently, the laminated body of the ceramic green sheets and the metal sheets is degreased and fired. The firing temperature is in a range from 1100° C. to 1850° C., for example. A gas contained in a firing atmosphere at the time of firing is stored inside the hollow portion. The type of gas differs depending on the material of the prepared ceramic green sheets. When the hollow portion is a closed space, by setting the firing atmosphere at the time of firing to a vacuum state, gas is discharged through communication holes in the ceramic green sheets generated at the time of degreasing, and the hollow portion can be set to a vacuum state or a reduced pressure state. Instead of the metal sheet, a metal paste or a wire may be used. Upon completion of the degreasing and firing of the laminated body, the shower plate according to the present disclosure is achieved.

Effects

As described above, the shower plates according to an embodiment (e.g., the shower plates 1 and 1A to 1J) include the bases (e.g., the bases 10 and 10A to 10J), the resistance heating elements (e.g., the resistance heating elements 30 and 30A), the channels (e.g., the channel 40), and the hollow portions (60, 60B, 60D, 60E to 60H, and 60J). The base is made of ceramic and has a plate shape. The resistance heating element is located inside the base along a first surface (e.g., the upper surface 101) of the base. The channel is located inside the base and includes an intermediate channel (e.g., the intermediate channel 42) that is located between the resistance heating element and a second surface (e.g., the lower surface 102) on a side opposite to the first surface of the base and extends in the planar direction of the base. The hollow portion is located adjacent to the intermediate channel in the planar direction of the base inside the base. Thus, with the shower plates according to an embodiment, the thermal uniformity of the fluid (e.g., the process gas) flowing through the channel may be improved.

The hollow portion according to an embodiment may be located between the intermediate channel and the side surface (e.g., the side surface 103) continuous with the first surface and the second surface of the base inside the base. As a result, with the shower plates according to an embodiment, a situation in which the heat of the channel heated by the resistance heating element is transmitted to the outside in the planar direction of the base and finally released from the side surface of the base into the external atmosphere may be suppressed.

The hollow portion according to an embodiment may extend in an annular shape surrounding the outer periphery of the intermediate channel in a view of a cross section in the planar direction of the base. This allows the shower plates according to an embodiment to suppress the thermal conduction from the intermediate channel to the outside in the planar direction of the base at the whole perimeter of the base.

The hollow portion according to an embodiment may be located adjacent to the intermediate channel with the partition wall (e.g., the partition wall 104, 104F, or 104G) interposed therebetween. One wall surface of the partition wall located on a side of the hollow portion may come closer to the other wall surface of the partition wall located on a side of the intermediate channel as the distance from the resistance heating element increases. The one wall surface of the partition wall located on a side of the hollow portion may be a tapered surface or stepped surface. This allows the shower plates according to an embodiment to concentrate the heat generated in the resistance heating element on the inner side surface of the intermediate channel to suppress the thermal conduction from the intermediate channel to the outside in the planar direction of the base.

The hollow portion according to an embodiment may include a support (e.g., the support 105, 105D, or 105E) having one end located on the ceiling surface of the hollow portion and the other end located on the bottom surface of the hollow portion. As a result, with the shower plates according to an embodiment, the temperature of the process gas led out to the lower side of the lower surface of the base may be maintained at a temperature suitable for the generation of plasma.

The support according to an embodiment may have a shape that grows wider toward the other end located on the bottom surface of the hollow portion. Further, the side surface of the support may be a tapered surface or a stepped surface. Thus, with the shower plates according to an embodiment, the transmission of the heat generated in the resistance heating element to the lower surface of the base through the support can be further promoted.

The shower plate according to an embodiment may further include an electrode (e.g., the electrode 50 or 50C) located between the intermediate channel and the second surface of the base inside the base. The electrode may extend to a position corresponding to the other end of the support in the planar direction of the base. This allows the shower plates according to an embodiment to promote the transmission of the heat generated in the resistance heating element to the electrode through the support to appropriately adjust the temperature of the electrode.

The resistance heating element according to an embodiment may extend to a position corresponding to the hollow portion in the planar direction of the base. Thus, with the shower plates according to an embodiment, since a difference in temperature between the hollow portion and the intermediate channel can be reduced, the thermal conduction from the intermediate channel to the outside in the planar direction of the base may be further suppressed.

The hollow portion according to an embodiment may include a first hollow portion (e.g., the first hollow portion 61) located adjacent to the intermediate channel in the planar direction of the base and a second hollow portion (e.g., the second hollow portion 62) located adjacent to the resistance heating element in the planar direction of the base. Thus, with the shower plates according to an embodiment, in addition to the thermal conduction from the intermediate channel to the outside in the planar direction of the base, the thermal conduction from the resistance heating element to the outside in the planar direction of the base may be suppressed.

The first hollow portion and the second hollow portion according to an embodiment may communicate with each other. This allows the shower plates according to an embodiment to further suppress the thermal conduction from the resistance heating element to the outside in the planar direction of the base.

The hollow portion according to an embodiment may include the first hollow portion located adjacent to the intermediate channel in the planar direction of the base, and a third hollow portion (e.g., the third hollow portion 63) located adjacent to the electrode in the planar direction of the base. Thus, with the shower plates according to an embodiment, in addition to the thermal conduction from the intermediate channel to the outside in the planar direction of the base, the thermal conduction from the electrode to the outside in the planar direction of the base may be suppressed.

The first hollow portion and the third hollow portion according to an embodiment may communicate with each other. This allows the shower plates according to an embodiment to further suppress the thermal conduction from the electrode to the outside in the planar direction of the base.

The channel according to an embodiment may further include a plurality of lead-out paths (e.g., the lead-out paths 43) that connect the intermediate channel and a plurality of lead-out ports (for example, the lead-out ports 121) located in the second surface of the base. The shower plate according to an embodiment may further include another hollow portion (e.g., the hollow portion 70) located adjacent to each lead-out path in the planar direction of the base inside the base. This allows the shower plates according to an embodiment to suppress, in addition to the thermal conduction from the intermediate channel to the outside in the planar direction of the base, the thermal conduction from each lead-out path to the outside in the planar direction of the base, thus allowing the thermal uniformity of the process gas flowing through the channel to be further improved.

The hollow portion according to an embodiment may store therein a gas having a lower coefficient of thermal conductivity than that of the ceramic constituting the base. This allows the shower plates according to an embodiment to improve the thermal uniformity of the fluid flowing through the channel.

The ceramic constituting the bases according to an embodiment may be aluminum oxide or yttrium oxide. In this case, the gas stored in the hollow portion may be a gas containing at least nitrogen and argon and having a larger volume ratio of nitrogen and argon than that of air. The ceramic constituting the base may be aluminum nitride or silicon nitride. In this case, the gas stored in the hollow portion may be a gas containing at least nitrogen and having a larger volume ratio of nitrogen than that of air. This allows the shower plates according to an embodiment to suppress the thermal conduction from the intermediate channel to the outside in the planar direction of the base by using an appropriate gas in accordance with the type of ceramic constituting the base.

The hollow portion according to an embodiment may be a channel through which another fluid different from the fluid (e.g., the process gas) flowing through the channel discussed above flows. The other fluid flowing through the hollow portion may be an inert gas. This allows the shower plates according to an embodiment to eliminate the need for providing the channel for the other fluid separately from the channel for the process gas.

Further effects and variations can be readily derived by those skilled in the art. Thus, a wide variety of aspects of the present invention are not limited to the specific details and a representative embodiment represented and described above. Accordingly, various changes are possible without departing from the spirit or scope of the general inventive concepts defined by the appended claims and their equivalents.

The invention claimed is:

1. A shower plate, comprising:

a base made of ceramic and having a plate shape;

a resistance heating element located inside the base along a first surface of the base;

a channel located inside the base and comprising an intermediate channel that is located between the resistance heating element and a second surface on a side opposite to the first surface of the base and extends in a planar direction of the base; and a hollow portion located adjacent to the intermediate channel in the planar direction of the base inside the base.

2. The shower plate according to claim 1, wherein the hollow portion is located between the intermediate channel and a side surface continuous with the first surface and the second surface of the base inside the base.

3. The shower plate according to claim 1, wherein the hollow portion annularly extends surrounding an outer periphery of the intermediate channel in a view of a cross section in the planar direction of the base.

4. The shower plate according to claim 1, wherein the hollow portion is located adjacent to the intermediate channel with a partition wall interposed between the hollow portion and the intermediate channel, and one wall surface of the partition wall located on a side of the hollow portion comes closer to the other wall surface of the partition wall located on a side of the intermediate channel side as a distance from the resistance heating element increases.

5. The shower plate according to claim 4, wherein the one wall surface of the partition wall located on the side of the hollow portion is a tapered surface or a stepped surface.

6. The shower plate according to claim 1, wherein the hollow portion comprises a support having one end located on a ceiling surface of the hollow portion and the other end located on a bottom surface of the hollow portion.

7. The shower plate according to claim 6, wherein the support has a shape that grows wider toward the other end of the support located on the bottom surface of the hollow portion.

8. The shower plate according to claim 7, wherein a side surface of the support is a tapered surface or a stepped surface.

9. The shower plate according to claim 6, further comprising an electrode located between the intermediate channel and the second surface of the base inside the base, wherein the electrode extends to a position corresponding to the other end of the support in the planar direction of the base.

10. The shower plate according to claim 1, wherein the resistance heating element extends to a position corresponding to the hollow portion in the planar direction of the base.

11. The shower plate according to claim 1, wherein the hollow portion comprises a first hollow portion located adjacent to the intermediate channel in the planar direction of the base, and a second hollow portion located adjacent to the resistance heating element in the planar direction of the base.

12. The shower plate according to claim 11, wherein the first hollow portion and the second hollow portion communicate with each other.

13. The shower plate according to claim 1, further comprising an electrode located between the intermediate channel and the second surface inside the base, wherein the hollow portion comprises a first hollow portion located adjacent to the intermediate channel in the planar direction of the base, and a third hollow portion located adjacent to the electrode in the planar direction of the base.

14. The shower plate according to claim 13, wherein the first hollow portion and the third hollow portion communicate with each other.

15. The shower plate according to claim 1, wherein the channel further comprises a plurality of lead-out paths connecting the intermediate channel and a plurality of lead-out ports located in the second surface of the base, and another hollow portion located adjacent to each of the plurality of lead-out paths in the planar direction of the base is further provided inside the base.

16. The shower plate according to claim 1, wherein the hollow portion stores a gas having a coefficient of thermal conductivity lower than a coefficient of thermal conductivity of ceramic constituting the base inside the hollow portion.

17. The shower plate according to claim 16, wherein the ceramic constituting the base is aluminum oxide or yttrium oxide, and the gas is a gas containing at least nitrogen and argon and having a larger volume ratio of nitrogen and argon than a volume ratio of air.

18. The shower plate according to claim 16, wherein the ceramic constituting the base is aluminum nitride or silicon nitride, and the gas is a gas containing at least nitrogen and having a larger volume ratio of nitrogen than a volume ratio of air.

19. The shower plate according to claim 1, wherein the hollow portion is a channel through which another fluid different from a fluid flowing through the channel flows.

20. The shower plate according to claim 19, wherein the other fluid flowing through the hollow portion is an inert gas.

* * * * *